United States Patent
Korenaga

(10) Patent No.: US 6,791,214 B2
(45) Date of Patent: Sep. 14, 2004

(54) MOVING-MAGNET LINEAR MOTOR, ALIGNER AND APPARATUS PROVIDED THEREWITH, AND METHOD FOR MANUFACTURING DEVICES USING THE SAME

(75) Inventor: Nobushige Korenaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/320,481

(22) Filed: Dec. 17, 2002

(65) Prior Publication Data

US 2003/0117026 A1 Jun. 26, 2003

(30) Foreign Application Priority Data

Dec. 21, 2001 (JP) ...................................... 2001-390540

(51) Int. Cl.[7] .............................................. H02K 41/00
(52) U.S. Cl. ........................................................ 310/12
(58) Field of Search ............................... 310/12, 13, 14

(56) References Cited

U.S. PATENT DOCUMENTS

| | | | | |
|---|---|---|---|---|
| 4,501,980 A | * | 2/1985 | Welburn | 310/12 |
| 4,702,992 A | * | 10/1987 | Ishii et al. | 430/272.1 |
| 4,859,974 A | * | 8/1989 | Kliman et al. | 335/229 |
| 5,130,583 A | * | 7/1992 | Andoh | 310/12 |
| 5,701,039 A | * | 12/1997 | Parison et al. | 310/12 |
| 6,037,680 A | | 3/2000 | Korenaga et al. | 310/12 |
| 6,265,793 B1 | | 7/2001 | Korenaga | 310/12 |
| 6,274,952 B1 | | 8/2001 | Chitayat | 310/12 |
| 6,417,584 B1 | * | 7/2002 | Chitayat | 310/12 |
| 6,573,623 B2 | * | 6/2003 | Tsuboi et al. | 310/12 |

FOREIGN PATENT DOCUMENTS

| | | |
|---|---|---|
| DE | 197 29 976 A1 | 1/1999 |
| EP | 1 043 830 A2 | 10/2000 |
| JP | 9-247921 | 9/1997 |

* cited by examiner

Primary Examiner—Thanh Lam
Assistant Examiner—Judson H. Jones
(74) Attorney, Agent, or Firm—Fitzpatrick, Cella, Harper & Scinto

(57) ABSTRACT

A moving-magnet, linear motor which substantially produces no cogging force is provided. The moving-magnet, linear motor has a mover and a stator. The mover has a plurality of permanent magnets orderly disposed along the traveling direction of the mover. The stator has a toothed iron-core having a plurality of teeth and a plurality of coils wound around the teeth thereof. The permanent magnets are disposed such that the two longitudinal ends of each permanent magnet are skewed with respect to each other by a tooth pitch of the toothed iron-core.

18 Claims, 17 Drawing Sheets

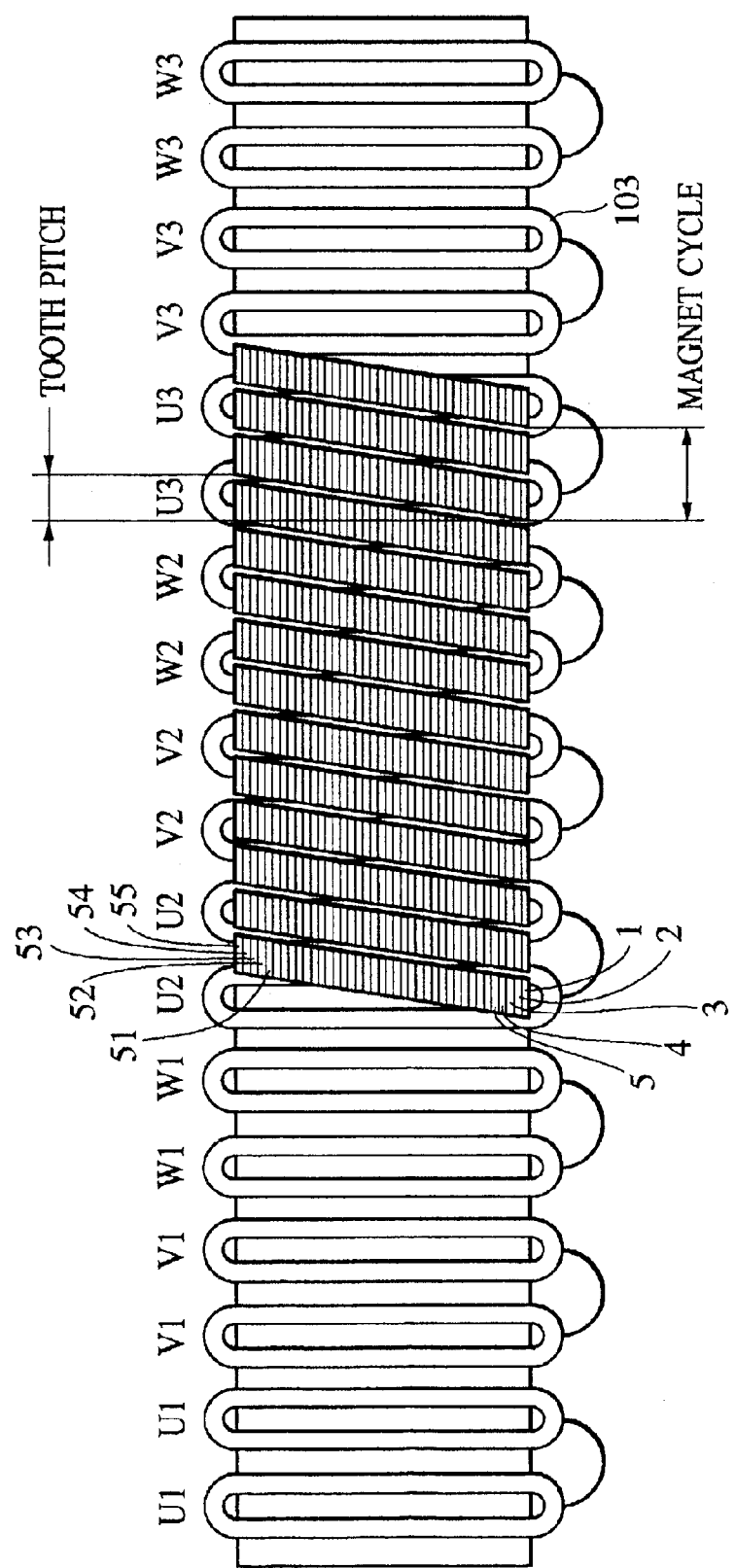

COGGING FORCE OF STRIP 1

TOOTH PITCH

COMBINED COGING FORCE

COGGING FORCE OF STRIP 52
COGGING FORCE OF STRIP 53
COGGING FORCE OF STRIP 54
COGGING FORCE OF STRIP 55

COGGING FORCE OF STRIP 1
COGGING FORCE OF STRIP 2
COGGING FORCE OF STRIP 3
COGGING FORCE OF STRIP 4
COGGING FORCE OF STRIP 5
COGGING FORCE OF STRIP 6
COGGING FORCE OF STRIP 7

TOOTH PITCH

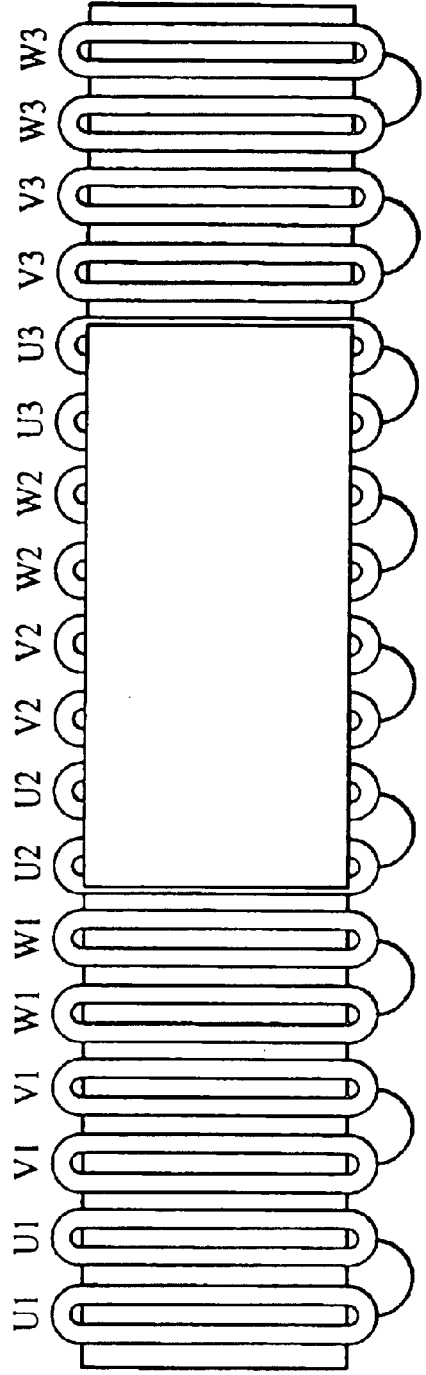
FIG. 9A
PRIOR ART
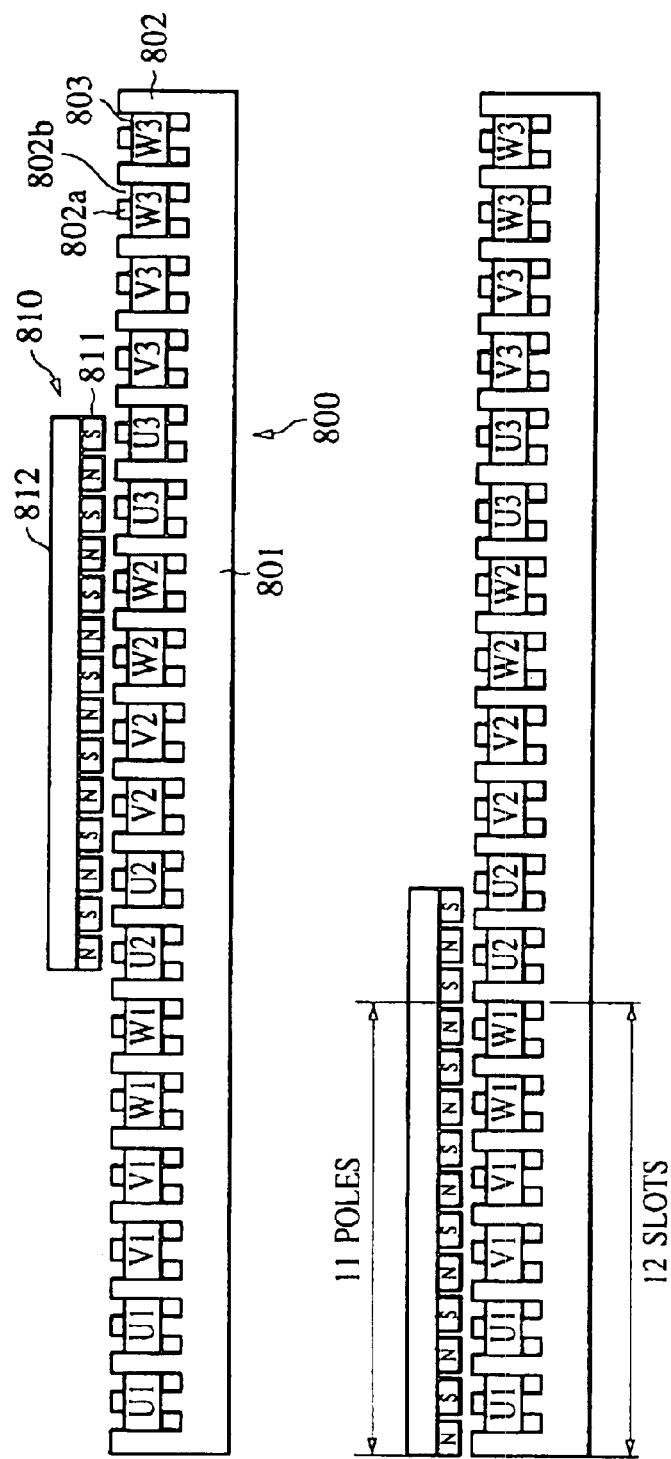
FIG. 9B
PRIOR ART
FIG. 9C
PRIOR ART

U1 U1 V1 V1 W1 W1 U2 U2 V2 W2 W2 U3 U3 V3 V3 W3 W3

U1 → U2

U1 U1 V1 V1 W1 W1 U2 U2 V2 V2 W2 W2 U3 U3 V3 V3 W3 W3

MOVING-MAGNET LINEAR MOTOR, ALIGNER AND APPARATUS PROVIDED THEREWITH, AND METHOD FOR MANUFACTURING DEVICES USING THE SAME

BACKGROUND OF THE INVENTION

1. Field of the Invention

The present invention relates to a moving-magnet, linear motor, an aligner provided therewith, and a method for manufacturing devices, for example, semiconductor devices, using the aligner.

2. Description of the Related Art

In various types of equipment, such as machine tools and semiconductor manufacturing apparatuses, linear motors have been used to achieve accurate positioning control. In machine tools, semiconductor manufacturing apparatuses, and the like, in addition to achieving accurate positioning control, linear motors are required to produce a large thrust force for improving productivity and to have a light-weight mover.

FIGS. 9A, 9B, and 9C are a top view, a side view, and an illustration of the configuration of a known moving-magnet, linear motor, respectively, by way of example. The linear motor includes a stator 800 and a mover 810. The stator 800 includes a base 801, a toothed-armature, iron-core 802 (sometimes referred to herein as "toothed iron-core" and iron-core) having a plurality of teeth, and a plurality of coils 803 respective coils of which are wound around respective teeth 802a of the iron-core 802. The iron-core 802 and the plurality of coils 803 are fixed on the base 801. The mover 810 has magnet rows, i.e., magnet units, formed of a plurality of permanent magnets 811, which are orderly disposed along the traveling direction of the mover 810, i.e., in the thrust direction of the linear motor, so as to face the upper surface of the stator 800 with a gap therebetween, and a back yoke 812 so as to provide an improved magnetic flux coupling (hereinafter, referred to as "flux linkage") of the rows of the magnets with the coils 803. The mover 810 is fixed to a stage (not shown) guided by a guide (not shown) and the stage is driven in the thrust direction of the linear motor.

The coils 803 along with the iron-core 802 allow the linear motor to produce a large thrust force.

Also, in the linear motor, the mover 810 is formed of magnet units so as to have a light weight. If the mover 810 is formed of coil units, the greater the number of wire turns, that is, the heavier the weight of the coils on the mover 810 so as to produce a larger thrust force, the heavier the mover 810 becomes. On the contrary, the number of wire turns, that is, the weight of the coils 803 fixed to the base 801 of the stator 800 is irrelevant to the weight of the mover 810 formed of magnet units.

In the linear motor, the length of 11 magnets 811 is equal to those of 12 stator iron-core teeth 802a and 12 stator iron-core slots 802b in the traveling direction of the mover 810. These 12 teeth 802a and 12 slots 802b form a unit of the linear motor having a three-phase configuration. That is, this linear motor has a so-called "11-pole, 12-slot configuration".

The stator coils 803 are connected so as to form a three-phase configuration, i.e., a U, V, and W phase configuration. The two adjacent coils in each phase are connected either in series or in parallel.

In the linear motor shown in FIGS. 9A to 9C, the stator 800 has 36 slots 802b forming three units of three U, V, and W phase configurations. For ease of understanding, the coils in the U phase are taken as an example, and the coils in the first, second, and third units are referred to as U1, U2, and U3 coils, respectively. The U1 to U3 coils are connected to each other either in an in-phase or an opposite-phase mode with respect to the electrical degrees thereof, and are energized only when they face the magnets 811. That is, the U1 to U3 coils are switched over in accordance with the travel of the magnets 811. The foregoing discussion also applies to the coils 803 in the V and W phases.

The magnet rows have 14 poles, that is, 14 magnets. Among these 14 magnets, 11 magnets mainly contribute to producing a thrust force, and the remaining 3 magnets are provided so as to switch over the coils 803.

FIGS. 10A to 10J illustrate the positional relationships between the moving magnets 811 and the coils 803 to be energized. In these figures, the coils 803 marked x are to be energized. In this linear motor, basically, although no two pairs of coils 803 in the same phase are energized at the same time, the two pairs of coils 803, i.e., 4 coils=2 coils×2 pairs, are energized at the same time when these coils 803 face the moving magnets 811 at the same time. However, these coils are not energized at the instant of switch-over. The energizing currents are controlled by using sinusoidal currents so as to make the vectors of the flux linkages orthogonal to the vectors of the currents. This control is generally known as "sinusoidal driving". The linear motor produces a thrust force by performing the sinusoidal driving and the switch-over of the coils at the same time.

Although the U1 to U3 coils are connected either in an in-phase or an opposite-phase mode to each other in the previous explanation, the U1 and U3 coils are connected in an in-phase mode to each other, and are in an opposite-phase mode with respect to the U2 coils in this example, because the linear motor has a configuration formed of 11 poles and 12 slots and the number of the poles is odd. Since one pole corresponds to 180 electrical degrees (180°), when the number of poles is odd, the three-phase coils in a unit are in an opposite-phase mode with respect to the corresponding three-phase coils in the neighboring unit.

The linear motor provided with the iron-core produces a so-called "cogging force" caused by an attractive force between the permanent magnets and the iron-core. The cogging force occurs regardless of the existence of the energizing current, and deteriorates the positioning accuracy of the linear motor. Also, the cogging force requires additional energizing current for the linear motor to produce a necessary thrust force and thereby causes the amount of heat produced by the linear motor to increase.

To solve these problems, some methods have been proposed. For example, the moving magnets may have an additional compensation pole so as to compensate for an apparent cogging force, and a plurality of linear motors may be used so as to shift the phases of the coils of one linear motor from those of the corresponding coils of the other linear motors. However, these methods only remove specific harmonic components of the cogging force and have not managed to completely eliminate the cogging force, including the harmonic components thereof.

SUMMARY OF THE INVENTION

The present invention has been made in view of the above-described background. Accordingly, it is an object of the present invention to provide a moving-magnet, linear motor, which has reduced cogging force, preferably nearly zero.

In accordance with a first aspect of the present invention, a moving-magnet, linear motor comprises a mover and at least one stator. The mover comprises a plurality of permanent magnets orderly disposed along the traveling direction thereof. The stator comprises a toothed iron-core with a plurality of teeth and a plurality of coils wound around the teeth of the iron-core. The two longitudinal ends of at least one permanent magnet among the plurality of permanent magnets are skewed with respect to each other substantially by a positive, integral multiple of a tooth pitch of the toothed iron-core.

Also, another moving-magnet, linear motor comprises a mover and at least one stator. The mover comprises a plurality of permanent magnets orderly disposed along the traveling direction thereof. The stator comprises a toothed iron-core with a plurality of teeth and a plurality of coils wound around the teeth of the iron-core. A cogging force produced by at least one permanent magnet among the plurality of permanent magnets has a phase changing from 0 to 360 degrees (0° to 360°) in a continuous or multistep manner along the length direction of the permanent magnet.

In the moving-magnet, linear motor according to the present invention, each permanent magnet may have a shape, which is approximately a shape of parallelogram, or another polygon.

In the moving-magnet, linear motor according to the present invention, the length of each permanent magnet is preferably equal to or smaller than the width of the toothed iron-core, wherein the length of each permanent magnet and the width of the iron-core extend in a direction orthogonal to the traveling direction of the moving magnets.

In the moving-magnet, linear motor according to the present invention, a tooth pitch of the toothed iron-core is preferably equal to or smaller than a magnet cycle of the permanent magnets.

The moving-magnet, linear motor according to the present invention, the foregoing at least one stator may comprise two stators disposed so as to sandwich the mover therebetween.

In accordance with a second aspect of the present invention, an aligner for exposing a pattern formed on an original plate onto a substrate comprises at least one driver for driving at least one of the original plate and the substrate. The driver includes the moving-magnet, linear motor according to the first aspect of present invention. For example, the foregoing moving-magnet, linear motor is applied to at least one of drivers for driving an original plate stage, i.e., a reticle stage, and a substrate stage, i.e., a wafer stage.

In accordance with a third aspect of the present invention, a semiconductor manufacturing apparatus, or a machine tool, comprises at least one driver including the moving-magnet, linear motor according to the first aspect of the present invention.

In accordance with a fourth aspect of the present invention, a method for manufacturing devices, in particular semiconductor devices, comprises the steps of (1) applying a photosensitive agent on a substrate, (2) exposing a pattern on an original plate onto the substrate having the photosensitive agent applied thereon, and (3) developing the substrate having the pattern exposed thereon. The aligner according to the second aspect of the present invention is used in the exposing step.

Further objects, features, and advantages of the present invention will become apparent from the following description of the preferred embodiments with reference to the attached drawings.

BRIEF DESCRIPTION OF THE DRAWINGS

FIG. 3 illustrates the principle of the moving-magnet, linear motor according to the first embodiment.

FIGS. 9A, 9B, and 9C illustrate the configuration of a known moving-magnet, linear motor.

DETAIL DESCRIPTION OF THE INVENTION

Linear motors according to preferred embodiments of the present invention will be described with reference to the accompanying drawings.

Figure 1A:
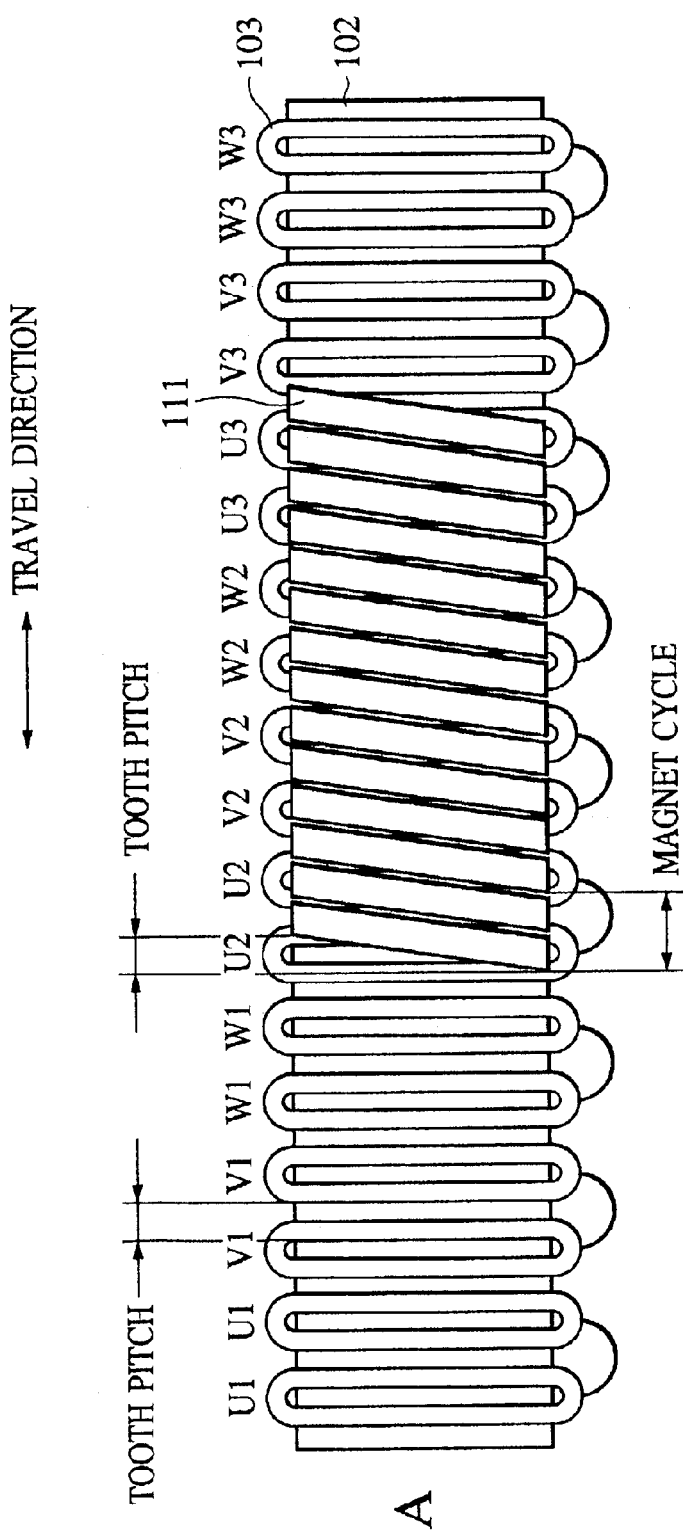
FIGS. 1A and 1B illustrate the configuration of a moving-magnet, linear motor according to a first embodiment of the present invention.
Figure 1B:
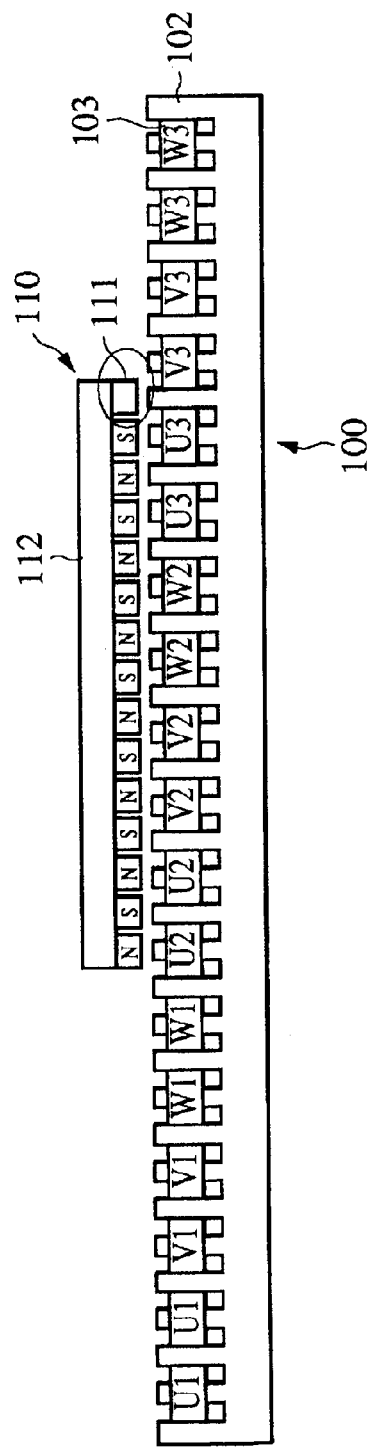

FIGS. 1A and 1B illustrate the structure of a moving-magnet, linear motor according to a first embodiment of the present invention, wherein FIG. 1A is a top view illustrating the linear motor in which a back yoke 112 of a mover 110 is removed and the FIG. 1B is a side view of the linear motor.

The linear motor according to the first embodiment has a stator 100 and the mover 110. The stator 100 has a toothed-armature, iron-core 102 with a plurality of teeth and a plurality of coils 103 wound around the teeth of the iron-core 102. The mover 110 has magnet rows formed of a plurality of permanent magnets 111, which are orderly disposed along the traveling direction of the mover 110, i.e., in the thrust direction of the linear motor, and a back yoke 112.

Each permanent magnet 111 forming the corresponding magnet row of the mover 110 has a polygonal shape, such as a parallelogram, a rectangle, and a square and the width thereof extends along the traveling direction of the mover 110. Also, the permanent magnets 111 are arranged such that the two longitudinal ends of at least one permanent magnet 111 are skewed with respect to each other in the traveling direction of the linear motor by a factor "N", where N is a positive integer, times, i.e., multiplied by, a tooth pitch of the toothed-armature, iron-core 102.

Preferably, the two longitudinal ends of each permanent magnet 111 are skewed with respect to each other in the traveling direction of the linear motor by N times the tooth pitch of the toothed-armature, iron-core 102. However, the permanent magnets 111 are not limited to the foregoing arrangement, and the same applies to the following descriptions.

FIGS. 1A and 1B according to the first embodiment illustrate a case of the linear motor in which N is equal to 1. That is, in the linear motor according to the first embodiment, the two longitudinal ends of each moving permanent magnet 111 are skewed with respect to each other in the traveling direction of the mover 110 by one tooth pitch, i.e., N=1. The cogging force of the linear motor decreases to nearly zero only when the amount of the foregoing skew of the two longitudinal ends is substantially equal to N times the tooth pitch, otherwise the cogging force increases.

In this embodiment, it should be understood that when the amount of the foregoing skew is substantially equal to N times the tooth pitch, the magnitude of the cogging force is substantially negligible so that the mover 110 travels smoothly.

The length of each magnet 111 extending along a direction, which is orthogonal to the traveling direction of the mover 110, is preferably the same as or slightly smaller than the width of the iron-core 102; however, the magnets 111 are not limited to this length.

Figure 2:
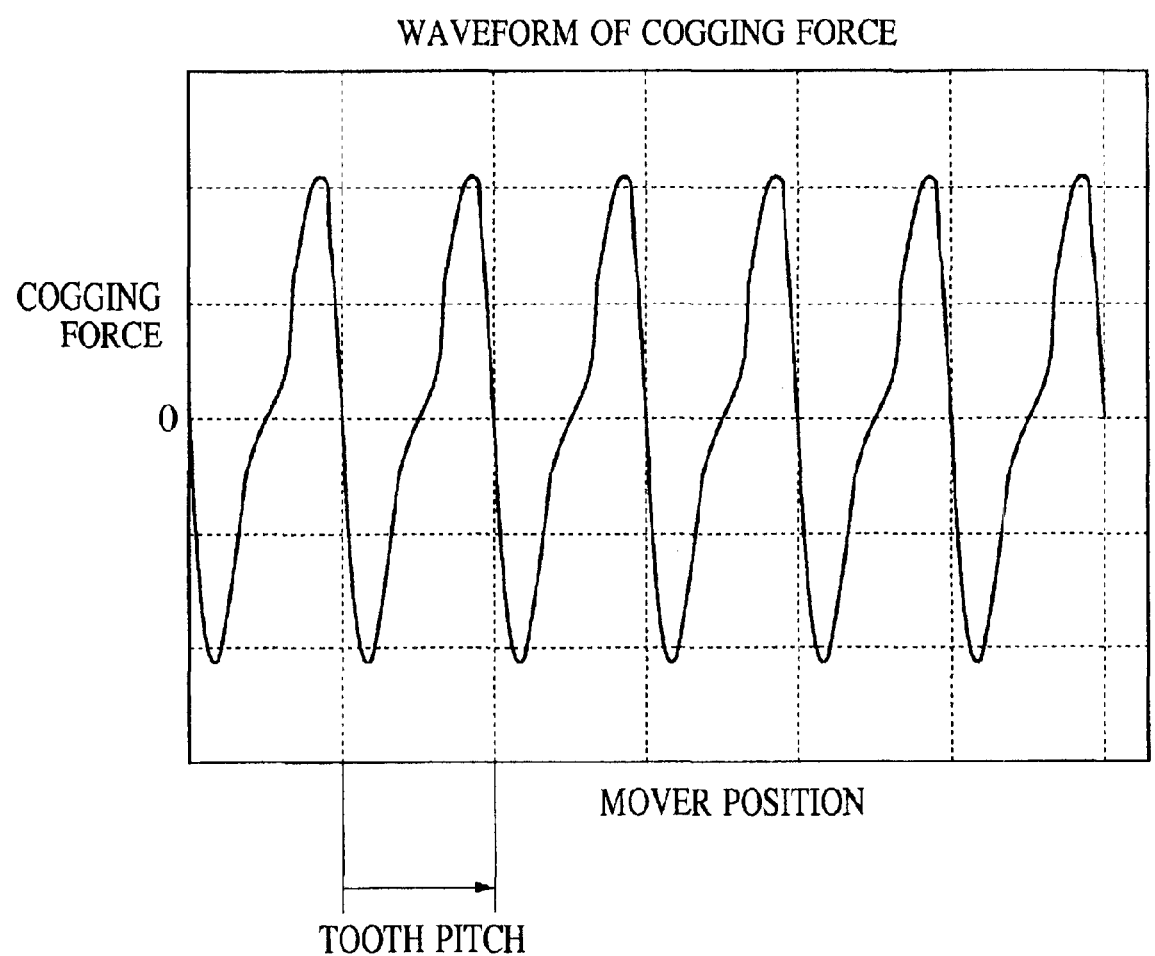
FIG. 2 illustrates the cogging force vs. position relationship of a traveling mover of a known moving-magnet, linear motor shown in FIGS. 9A to 9C.

FIG. 2 illustrates the cogging force vs. position of a traveling mover 810 of a known moving-magnet, linear motor shown in FIGS. 9A to 9C. As shown in FIG. 2, the cogging force of the known linear motor shown in FIGS. 9A to 9C is expressed by a periodic function containing harmonic components in which the fundamental period is one tooth pitch of an iron-core 802.

Each permanent magnet 111 of the mover 110 of the moving magnet type linear motor according to the first embodiment has a configuration in which a magnet row, i.e., a magnet unit, is formed of a plurality of strip magnets (hereinafter, also simply referred to as "strips"), as shown in FIG. 3, and the width of each strip is very small. In FIG. 3, each permanent magnet 111 is formed of 55 strips, 1 to 55, by way of example.

Figure 4A:
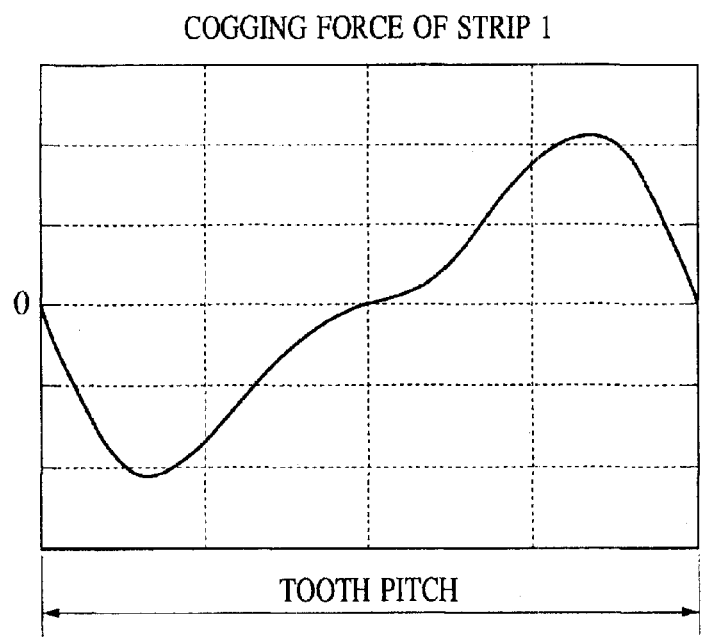
FIGS. 4A and 4B are illustrations of cogging forces of the moving-magnet, linear motor according to the first embodiment.

A set of strips, each strip being disposed in the same position of the corresponding permanent magnet 111, has a cogging-force waveform as shown in FIG. 4A whose shape is similar to that of the known linear motor and whose phase is shifted from that of the known linear motor, and the amplitude of the cogging force shown in FIG. 4A is 1/55 of the amplitude of the cogging force shown in FIG. 2.

Figure 4B:
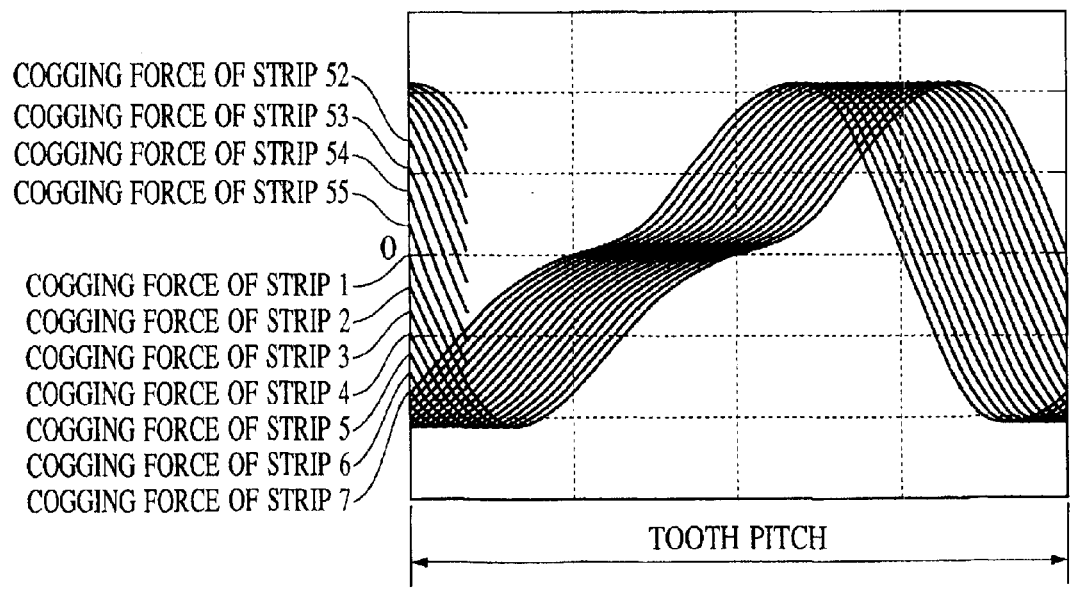

The overall cogging-force waveform of the permanent magnets 111 is obtained by combining the cogging-force waveforms of all sets of strips 1 to 55 (hereinafter, a set of strips "M" is simply referred to as a "strip set M", where M=1 to 55,) while shifting the phase of the cogging-force waveform of one strip set step-by-step, as shown in FIG. 4B, wherein the phase is given by an electrical degree over a period corresponding to one tooth pitch of the iron-core 102.

In the linear motor according to the first embodiment, each magnet 111 is formed so as to have a polygonal shape such as a parallelogram, a rectangle, or a square so that the two longitudinal ends of the magnet 111 are skewed with respect to each other in the traveling direction of the linear motor by one tooth pitch of the iron-core 102. Accordingly, the strip sets 1 and 55 have cogging-force waveforms whose phases are close to each other, that is, shifted only by 360/55 degrees (360°/55°), and whose shapes are substantially the same as each other. Also, any two adjacent strip sets have cogging-force waveforms whose phases are close to each other, that is, shifted only by 360/55 degrees (360°/55°), and whose shapes are substantially the same as each other. When these waveforms of all strip sets 1 to 55 of the magnets 111 are combined by shifting the phase of one of the cogging-force waveforms step-by-step in a multistep manner, that is, in 55 steps in this example, from 0 to 360 degrees (0° to 360°), the combined cogging-force of the magnets 111 becomes zero at any position over the tooth pitch, since the combined cogging-force waveform of the magnets 111 at any position over one tooth pitch is obtained by summing the waveforms of all strip sets while shifting the phase of one of the waveforms step-by-step from 0 to 360 degrees (0° to 360°).

When the magnet 111 is in the shape of a parallelogram, as shown in FIG. 1A, the combined cogging force of the magnets 111 at each position is obtained by integrating the cogging-force waveform shown in FIG. 4A over one period, i.e., one tooth pitch, since the width of each strip actually is very small. Since the combined cogging force obtained by the integration described above is equivalent to that obtained by summing the cogging-force waveforms of all strip sets by continuously, or substantially continuously, shifting the waveform shown in FIG. 4A from 0 to 360 degrees (0° to 360°), the combined cogging force becomes zero regardless of the position along the traveling direction of the mover 110 that the magnets 111 lie. It should be understood that the term "zero" does not mean zero in a strict sense, but it means that the magnitude of the cogging force is substantially negligible so that the mover 110 travels smoothly.

Next, the relationship between the length of the magnet 111 and the width of the iron-core 102 will be described, wherein the length and the width extend along a direction, which is orthogonal to the traveling direction of the mover 110.

When the length of the magnet 111 is greater than the width of the iron-core 102, a cogging force is produced by the interaction between a portion of the magnet 111 protruding out from the iron-core 102 and the side surface of the iron-core 102.

When the length of the magnet 111 is equal to the width of the iron-core 102, hardly any cogging force is produced. However, even when the length of the magnet 111 is designed so as to be equal to the width of the iron-core 102, fabrication errors between the magnet 111 and the iron-core 102 sometimes cause them to be assembled in a relatively skewed manner. Thus, portions of the magnets 111 overlapping the iron-core 102 produce a combined cogging force which is different from that obtained by combining the cogging-force waveforms of all strip sets while shifting one of their phases step-by-step from 0 to 360 degrees (0° to 360°). As a result, a certain amount of cogging force may be produced. In addition, other portions of the magnets 111 protruding out from the iron-core 102 may produce another cogging force.

Figure 5:
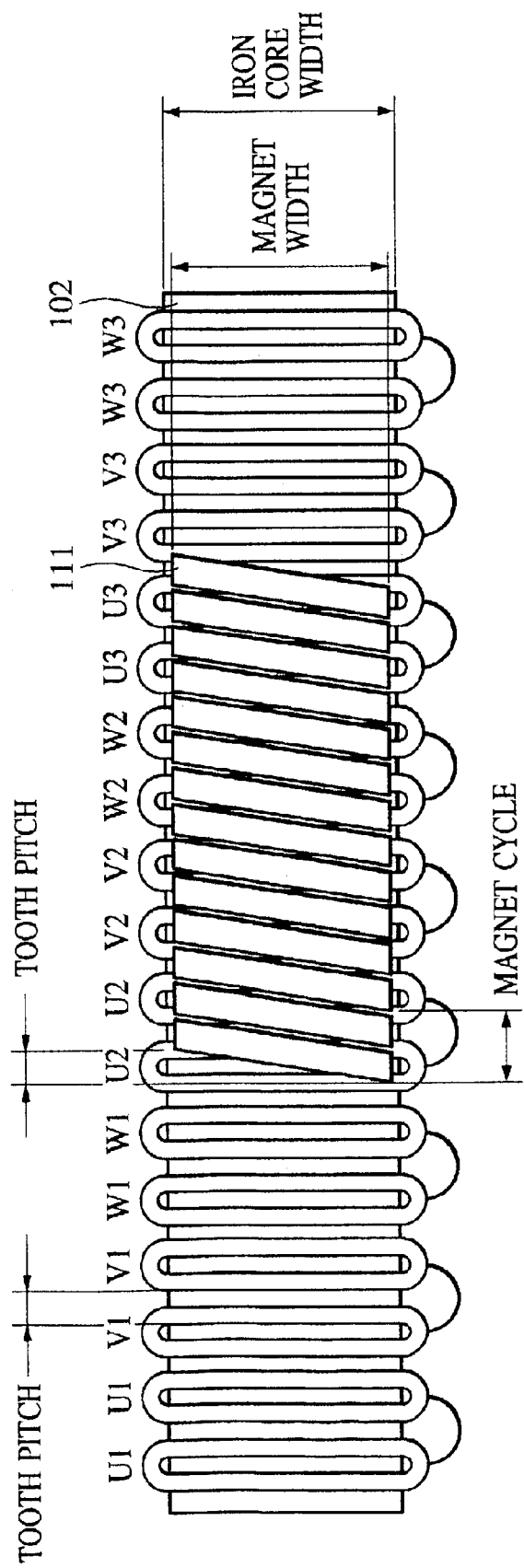
FIG. 5 illustrates the preferable relationships between magnet length and iron-core width.

Concerning the relationships between the length of the magnets 111 and the width of the iron-core 102, rather than the foregoing two cases, making the length of the magnets 111 a little smaller than the width of the iron-core 102 is preferable, as illustrated in an exaggerated manner in FIG. 5. In this case, the preferable amount of skew of the two longitudinal ends of the magnet 111 in the traveling direction is substantially equal to one tooth pitch of the iron-core 102. With this arrangement, when the fabrication error tolerance is set to be smaller than half the difference in the width of the iron-core 102 and the length of the magnet 111, the magnets 111 do not protrude out from the iron-core 102, and the combined cogging force becomes nearly zero.

In this example, since the combined cogging force is obtained by integrating one of the cogging-force waveforms of all strip sets over one period, the resultant combined cogging force also becomes nearly zero in theory even when the cogging waveform to be integrated has harmonic components. Also, it should be understood that the terms "substantially equal to" and "zero" are defined in the same fashion as described above.

Figure 6:
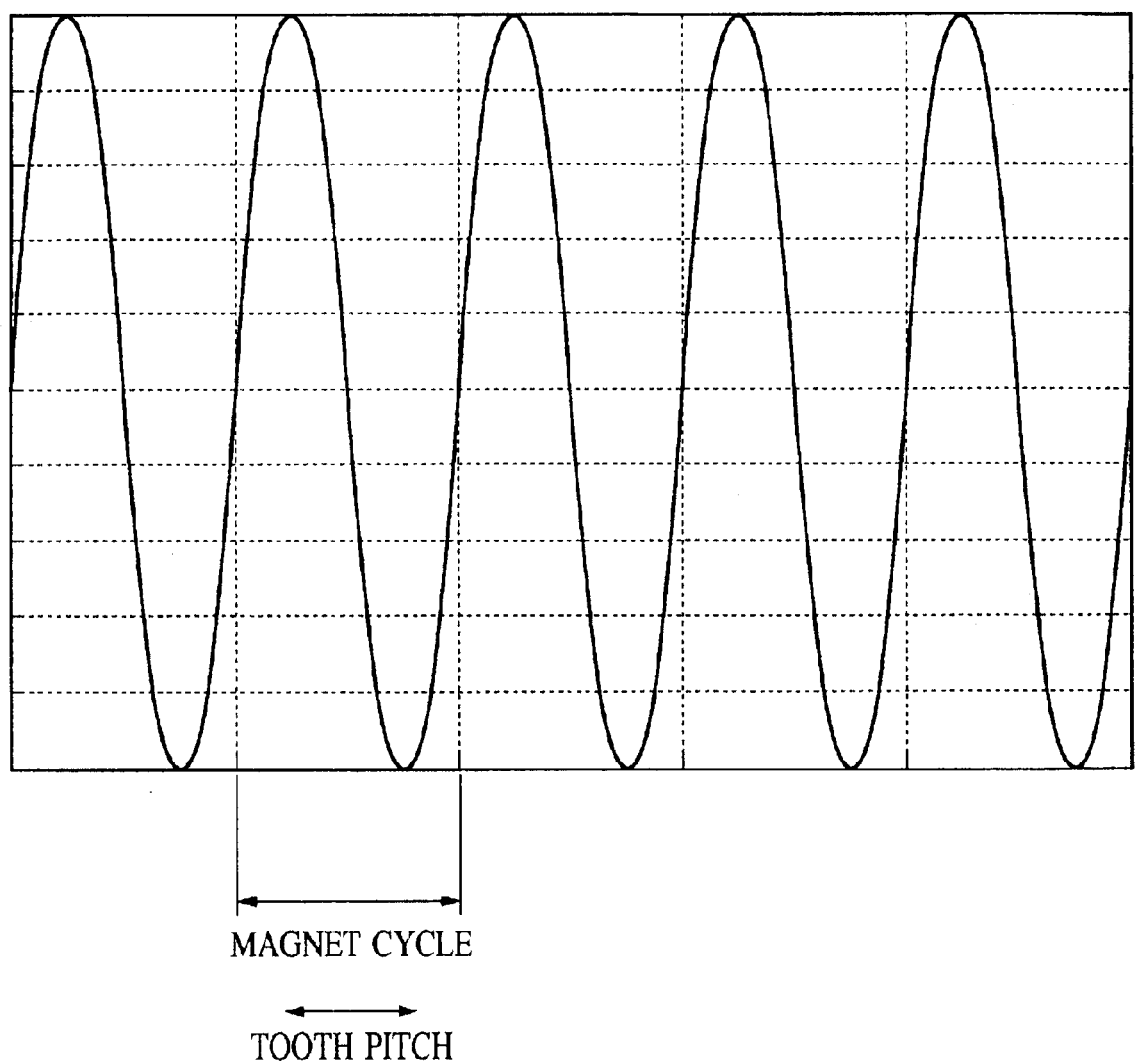
FIG. 6 is an illustration of a flux linkage waveform of a known moving-magnet, linear motor.

The thrust force, which is produced by the linear motor according to the first embodiment of the present invention, is proportional to the flux linkage of one coil produced by the magnets 111. The flux linkage of one coil in the known linear motor has an approximately sinusoidal waveform with a period corresponding to two pole pitches (hereinafter, two pole pitches are referred to as a "magnet cycle") of the magnets 111, as shown in FIG. 6.

The thrust force of the linear motor according to the first embodiment is obtained by combining thrust forces produced by the strip sets illustrated in FIG. 3. The flux linkage of one coil 103 produced by one strip set of all the magnets 111 is obtained by multiplying the magnitude of the waveform shown in FIG. 6 by $\frac{1}{55}$ and by shifting the phase of the same in accordance with the position of each strip of the corresponding magnet 111. In the linear motor according to the first embodiment, the flux linkage of one coil 103 is obtained by combining the flux linkages of the coil 103 produced by all strip sets of all the magnets 111. The manner of combining the flux linkages is similar to that of combining the cogging-force waveforms. While the cogging-force waveform is a periodic function having a period corresponding to one tooth pitch of the iron-core 102, the flux linkage waveform is another periodic function having a period corresponding to one magnet cycle of the magnets 111.

Figure 7A:
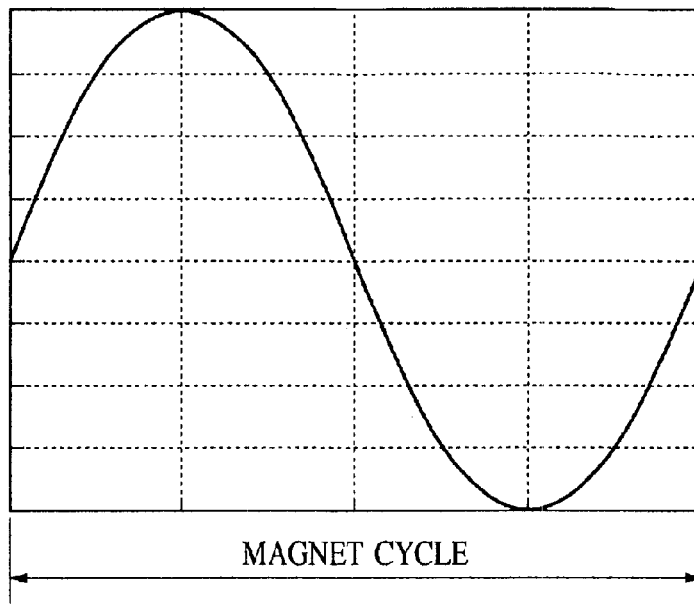
FIGS. 7A and 7B are illustrations of flux linkage waveforms of the moving-magnet, linear motor according to the first embodiment.
Figure 7B:
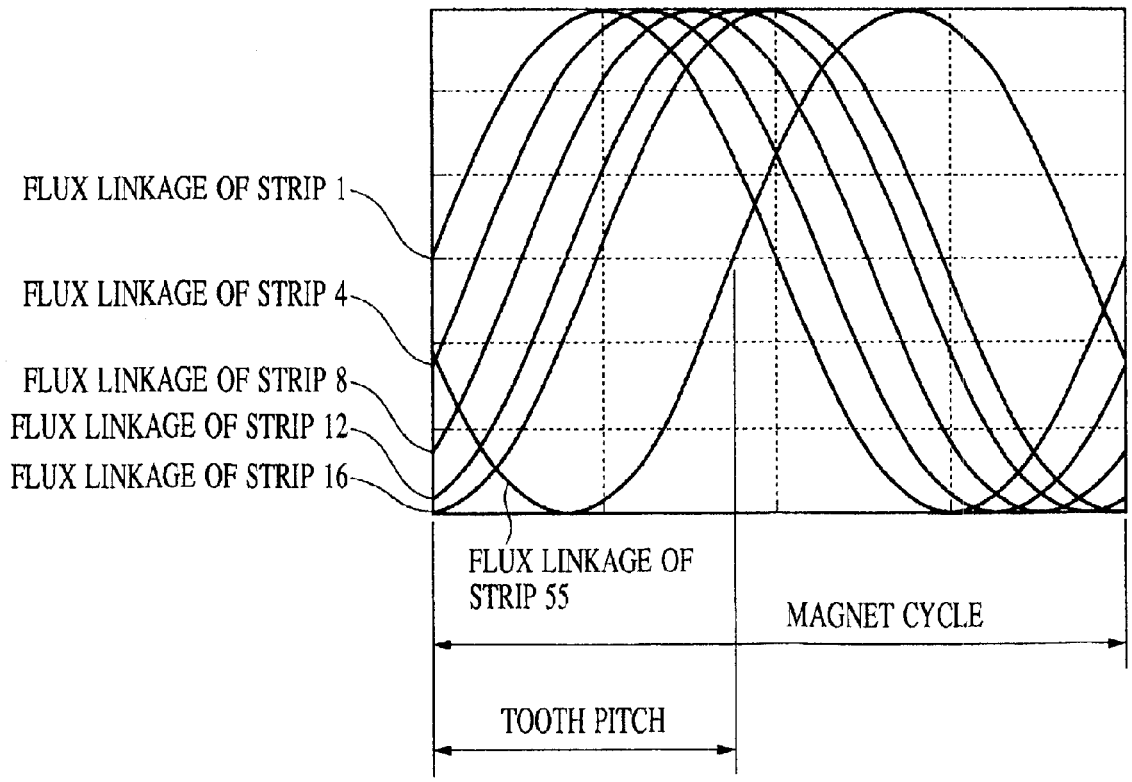

Accordingly, a skew of one tooth pitch corresponds to 360 electrical degrees (360°) with reference to a period of one tooth pitch, but does not correspond to 360 electrical degrees (360°) with reference to one magnet cycle. FIG. 7A illustrates the flux linkage having a sinusoidal waveform of the strip set 1 over one magnet cycle of the magnets 111. FIG. 7B illustrates the flux linkages of the strip sets 4, 8, 12, 16 and 55 in addition to that of the strip set 1, each having a sinusoidal waveform. By shifting the phases of the former four flux linkages, these flux linkages coincide with that of the strip set 1. The difference in phase between the two flux linkages of the strip sets 1 and 55 is a little smaller than half the magnet cycle of the magnets 111. Consequently, the combined flux linkage thereof does not become zero but it is considerably large, while the combined cogging force of all strips 1 to 55 becomes zero. As a result, the thrust force, which is proportional to the combined flux linkage, does not become zero but it is considerably large.

More particularly, in an 11-pole, 12-slot configuration, the amount of skew of one tooth pitch corresponds to 165 electrical degrees (165°) (=180 degrees (180°)×11/12) with reference to one magnet cycle. When the flux linkage of one coil in the known linear motor is assumed to have a sinusoidal waveform (actually, this is a sufficiently accurate approximation) having an amplitude of 1, the amplitude of the flux linkage of one coil of the linear motor according to the first embodiment is given by the average of cos θ in the range from θ=−165/2 to θ=+165/2 degrees, in other words, it is given by integrating cos θ from θ=−165/2 to θ=+165/2 degrees and then by dividing the integrated value by 165 degrees. This calculation can be accurately performed and provides a resultant value of about 0.7. That is, with this configuration of the linear motor according to the first embodiment, the cogging force of the linear motor becomes nearly zero and a thrust force having a magnitude of about 0.7 times that of the known linear motor is obtained.

Providing skewed stationary magnets in a moving-coil, linear motor with an iron-core is a commonly used technology. However, the present invention is not applied to a moving-coil, linear motor. The present invention is applied to a moving-magnet, linear motor since periods of the cogging-force and flux linkage waveforms can be designed independently of each other only in the moving-magnet, linear motor, while periods of the cogging-force and flux linkage waveforms in the moving-coil, linear motor always coincide with each other.

In the moving-coil, linear motor, the cogging force is produced in one magnet cycle. When the spirit of the present invention is directly applied to the moving-coil, linear motor, the two longitudinal ends of one magnet must be skewed by one magnet cycle. With this arrangement, not only does the cogging force become nearly zero, but the averaged flux linkage also becomes nearly zero at the same time at any position of the mover, thereby resulting in a machine, which is useless as a linear motor. That is, in the moving-coil, linear motor, since the degree of reduction in the cogging force is the same as that in the thrust force, the magnets cannot be skewed on a large scale. Accordingly, the cogging force does not become zero by skewing the magnets of the moving-coil, linear motor by a realistic amount, and only harmonic components of the cogging force are eliminated at the cost of a reduction in the thrust force of the linear motor.

Figure 8:
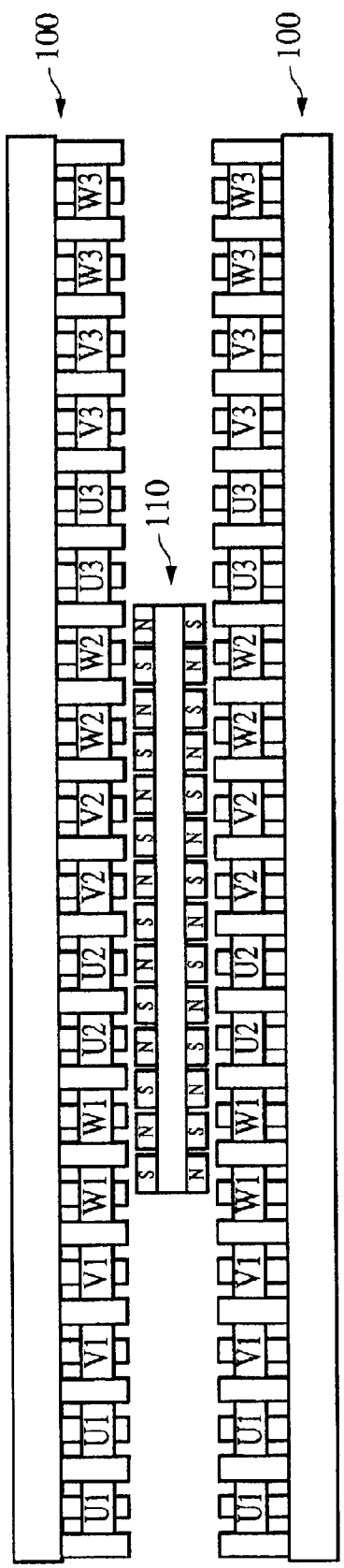
FIG. 8 illustrates the configuration of a moving-magnet, linear motor according to a second embodiment of the present invention.
Figure 10A:
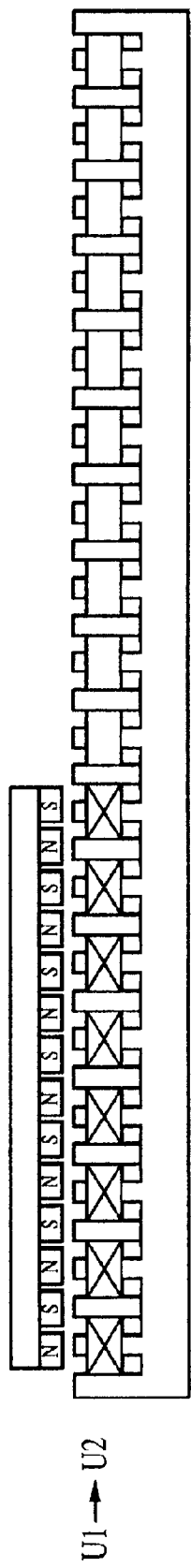
FIGS. 10A to 10J illustrate the positional relationships between moving magnets and coils to be energized.
Figure 10B:
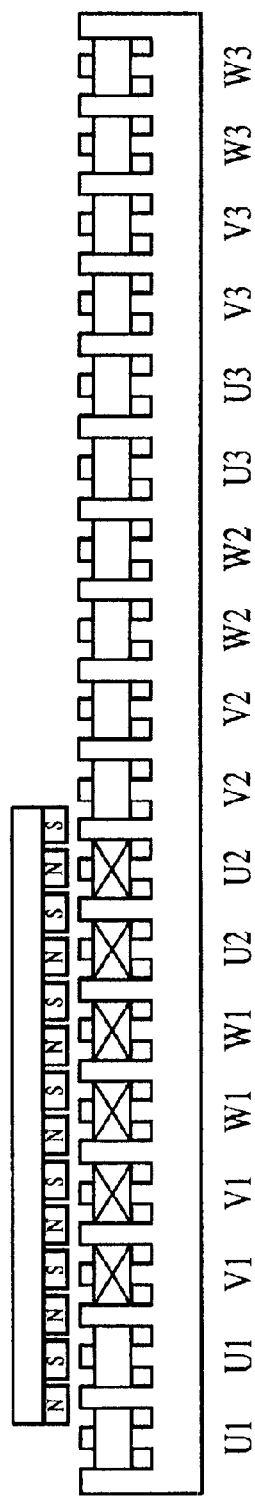
Figure 10C:
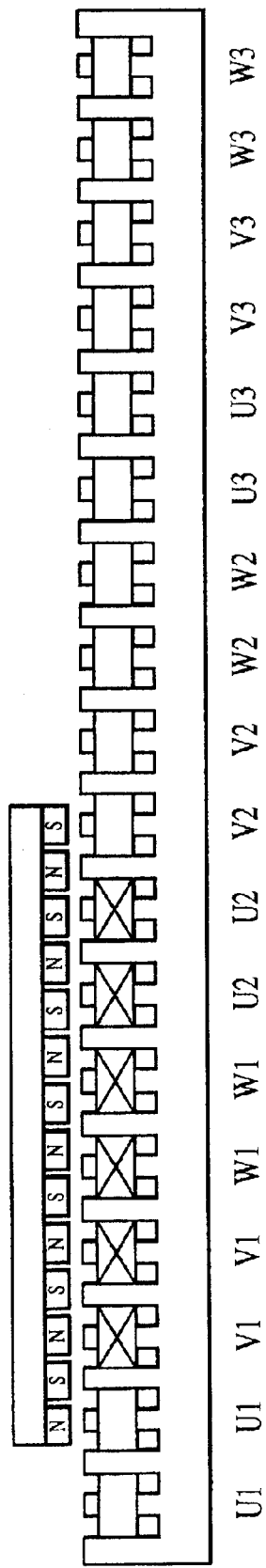
Figure 10D:
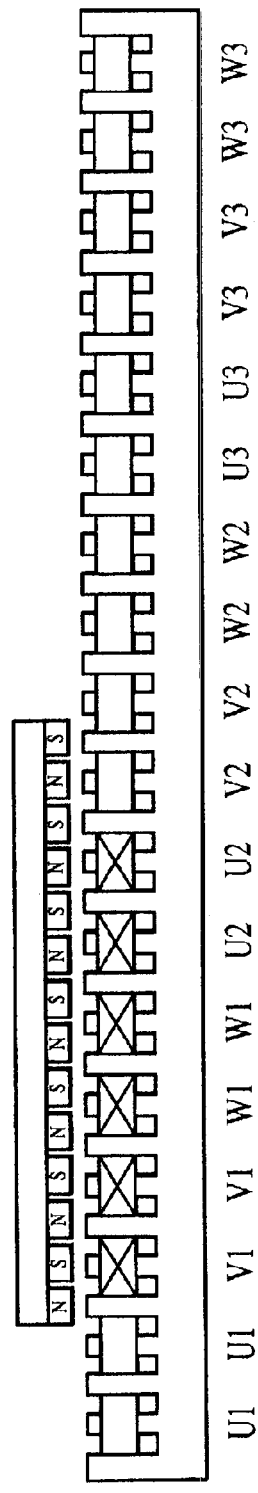
Figure 10E:
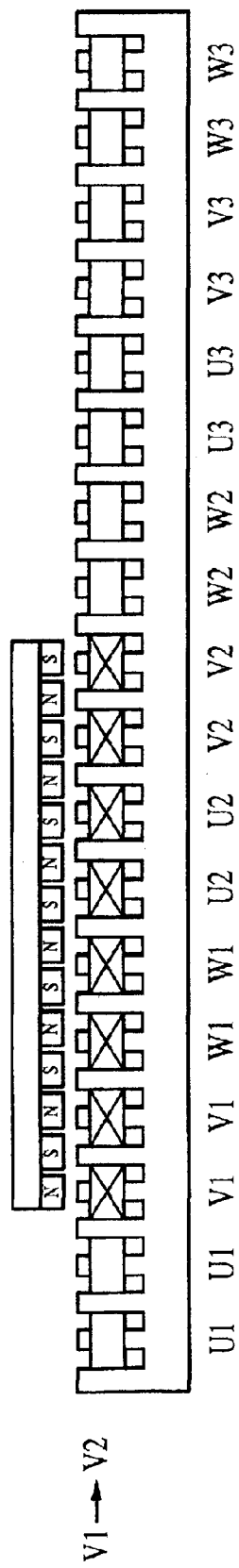
Figure 10F:
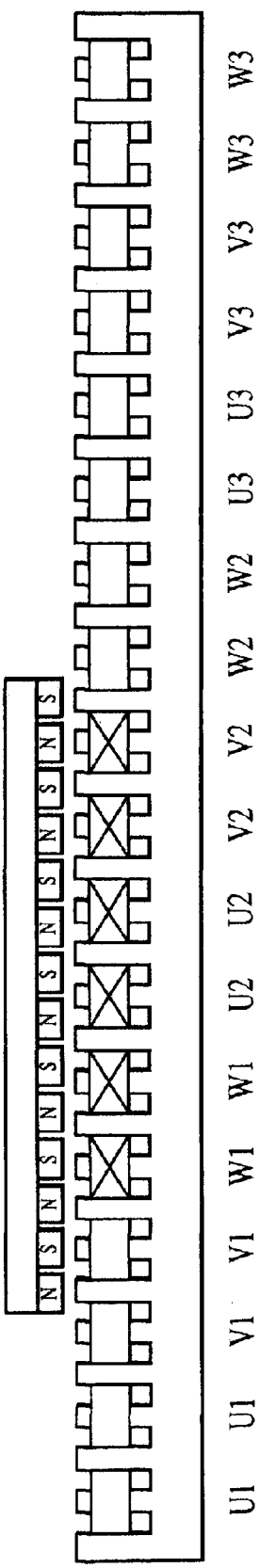
Figure 10G:
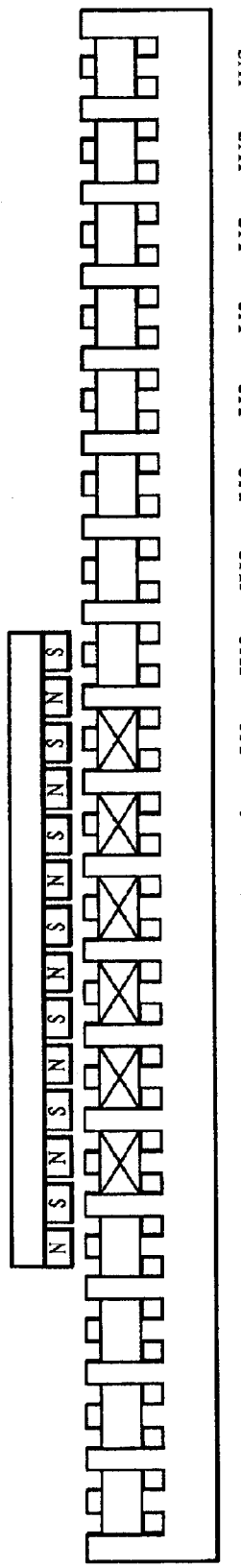
Figure 10H:
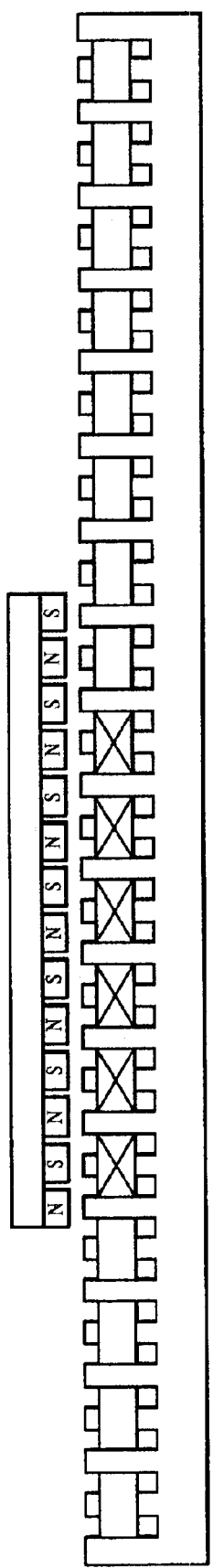
Figure 10I:
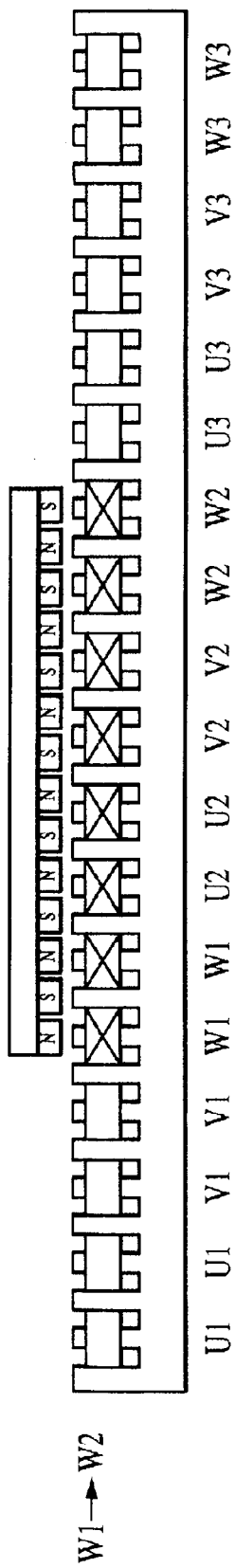
Figure 10J:
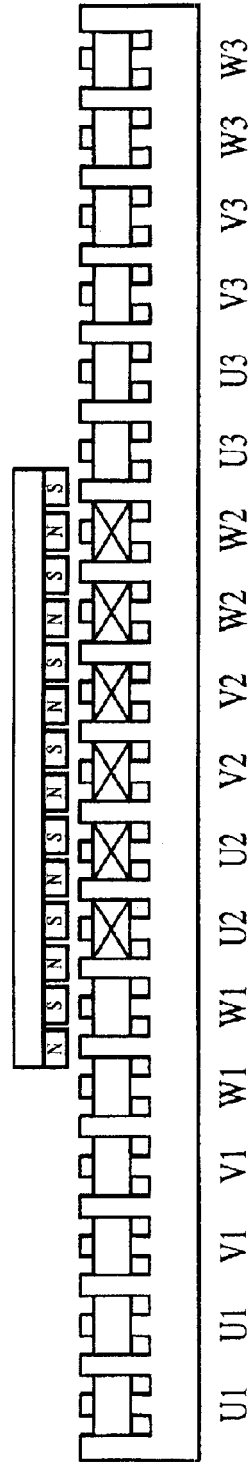

FIG. 8 illustrates the configuration of a moving-magnet, linear motor according to a second embodiment of the present invention. As shown in FIG. 8, the present invention is also applicable to a linear motor having a structure in which the mover 110 is sandwiched between the two stators 100. In this case, it is preferable to arrange the configuration such that the magnets on the mover 110 facing the upper stator 100 are skewed in a direction opposite to a direction of the magnet on the mover 110 facing the lower stator 100 so that a rotating moment is not exerted on the mover 110.

Although the linear motor according to the first embodiment shown in FIGS. 1A and 1B has an 11-pole, 12-slot configuration by way of example, the present invention is also applicable to a configuration having any number of poles and slots. In order to make the cogging force zero and at the same time have a large thrust force, it is desirable to have a large difference in length between the tooth pitch and the magnet cycle.

Figure 11:
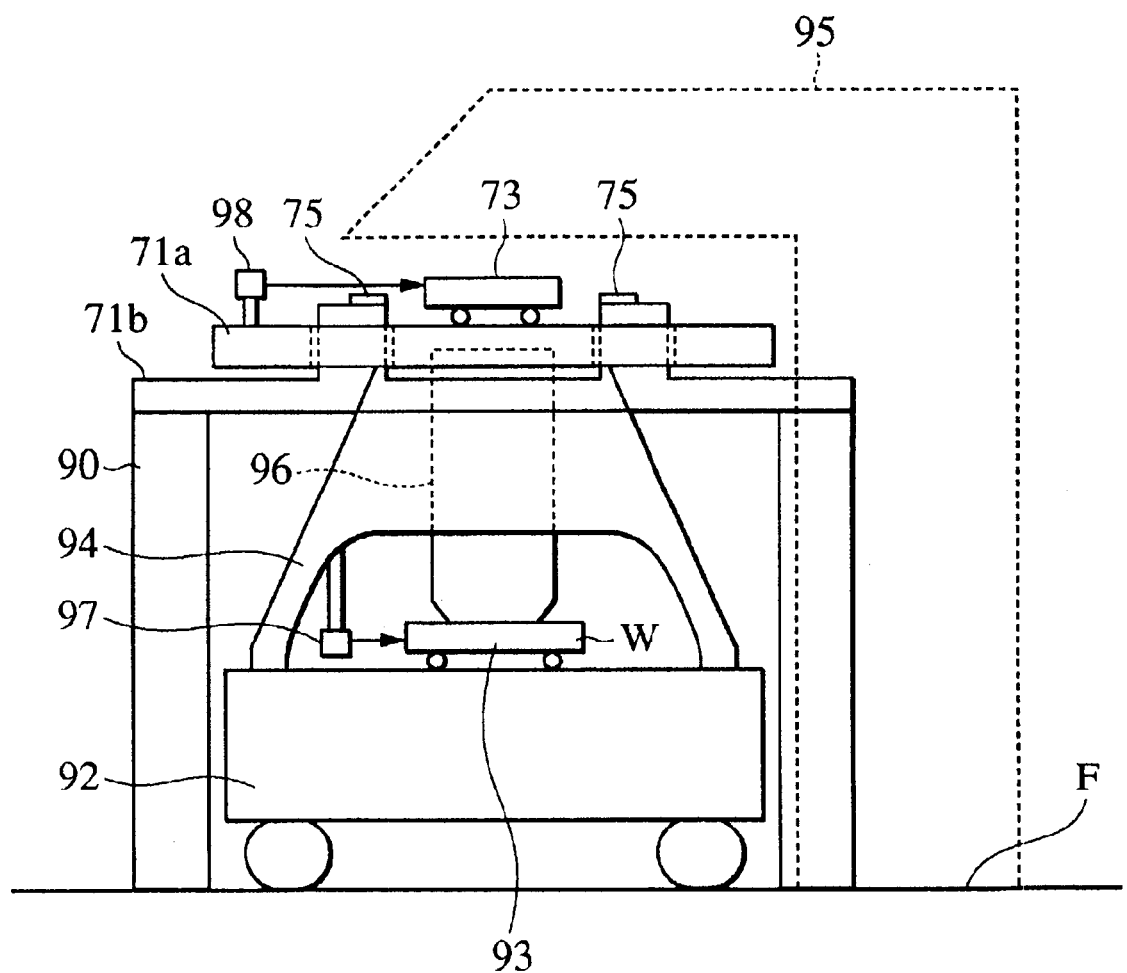
FIG. 11 is an illustration of the schematic structure of an aligner according to a third embodiment of the present invention.

FIG. 11 illustrates the schematic structure of a scanning aligner according to a third embodiment of the present invention. The scanning aligner has at least one stage incorporated therein, which uses the foregoing linear motor, and which serves as at least one of a reticle stage 73 and a wafer stage 93.

The reticle stage 73 is supported by a reticle stage base 71a, which is integrally formed with a frame 94. The wafer stage 93 is supported by a weighing table 92 which has the frame 94 disposed thereon in a standing manner. A linear motor base 71b is supported by a support frame 90, which is directly fixed to a floor F, and which is independent of the weighing table 92. Also, a light source 95 indicated by a dotted line in the figure is prepared so as to produce exposing light by which a reticle pattern on the reticle stage 73 is exposed onto a wafer W on the wafer stage 93.

The frame 94 supports not only the reticle stage base 71a but also a projection optical system 96, which lies between the reticle stage 73 and the wafer stage 93. Two stators 75 of the linear motor, serving as a driver for accelerating or decelerating the reticle stage 73, are supported by the support frame 90, which is independent of the frame 94. Accordingly, there is no risk in that a force produced in the stators 75, which is a reactive force against the thrust force of the linear motor for driving the reticle stage 73, is transferred to the wafer stage 93 and thus, either disturbs another driver, e.g., another linear motor, used for the wafer stage 93, or vibrates the projection optical system 96.

The wafer stage 93 is scanned by the driver in synchronism with the reticle stage 73. While the reticle stage 73 and the wafer stage 93 are being scanned, the positions of the reticle stage 73 and the wafer stage 93 are continuously detected by interferometers 97 and 98, respectively, and the detected results are returned to the respective drivers. With this arrangement, the scanning aligner not only accurately controls the scanning start positions of the reticle stage 73 and the wafer stage 93 so as to be synchronized with each other but also accurately controls the canning speeds of the same in the constant scanning speed region thereof.

Figure 12:
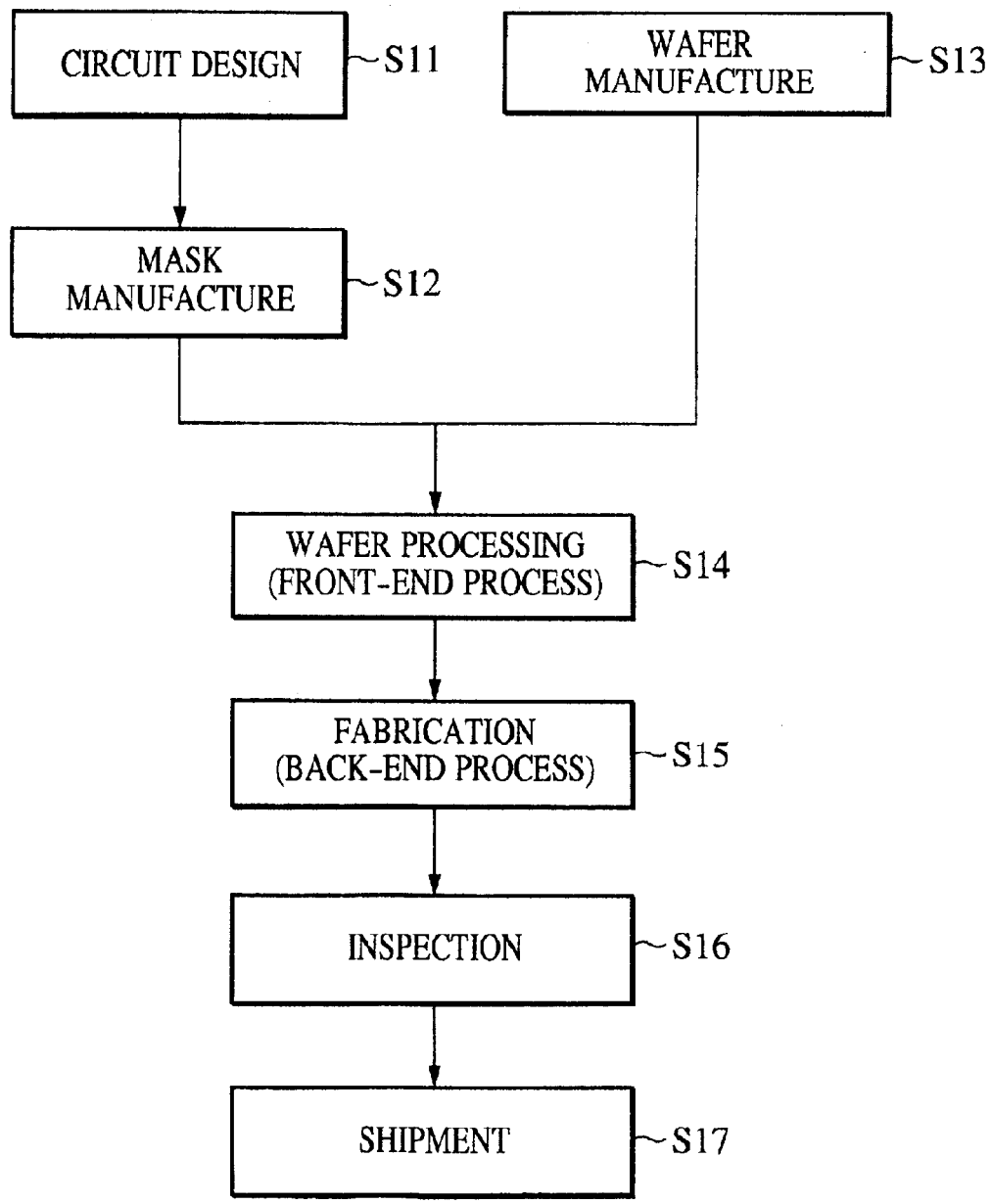
FIG. 12 is a flowchart illustrating the manufacture of semiconductor devices.

FIG. 12 illustrates a flowchart of a method for manufacturing devices, such as semiconductor chips, e.g., ICs or LSIs, liquid crystal panels, CCDs, thin film magnetic heads, or micro-machines. Referring now to FIG. 12, the method for manufacturing semiconductor devices using the above-described aligner, according to a fourth embodiment of the present invention, will be described. In Step S11, a circuit pattern of the semiconductors is designed. In Step S12, a mask having the designed circuit pattern formed thereon is manufactured. In Step S13, a wafer serving as a substrate is manufactured using a material, such as silicon. In Step S14, a process, which is referred to as a "front-end process", forms a circuit on the wafer with a lithography technique using the manufactured mask and wafer. In Step S15, a process, which is referred to as a "back-end process", dices the wafer prepared in Step S14 into semiconductor chips, which are fabricated into semiconductor devices. Step S15 includes an assembly step, such as dicing and bonding; a packaging step, such as encapsulating the semiconductor chip; and the like. In Step S16, the fabricated semiconductor devices are inspected by checking the operations thereof, testing the endurances thereof, and the like. In Step S17, the complete semiconductor devices, which have been manufactured according to the foregoing Steps, are shipped.

Figure 13:
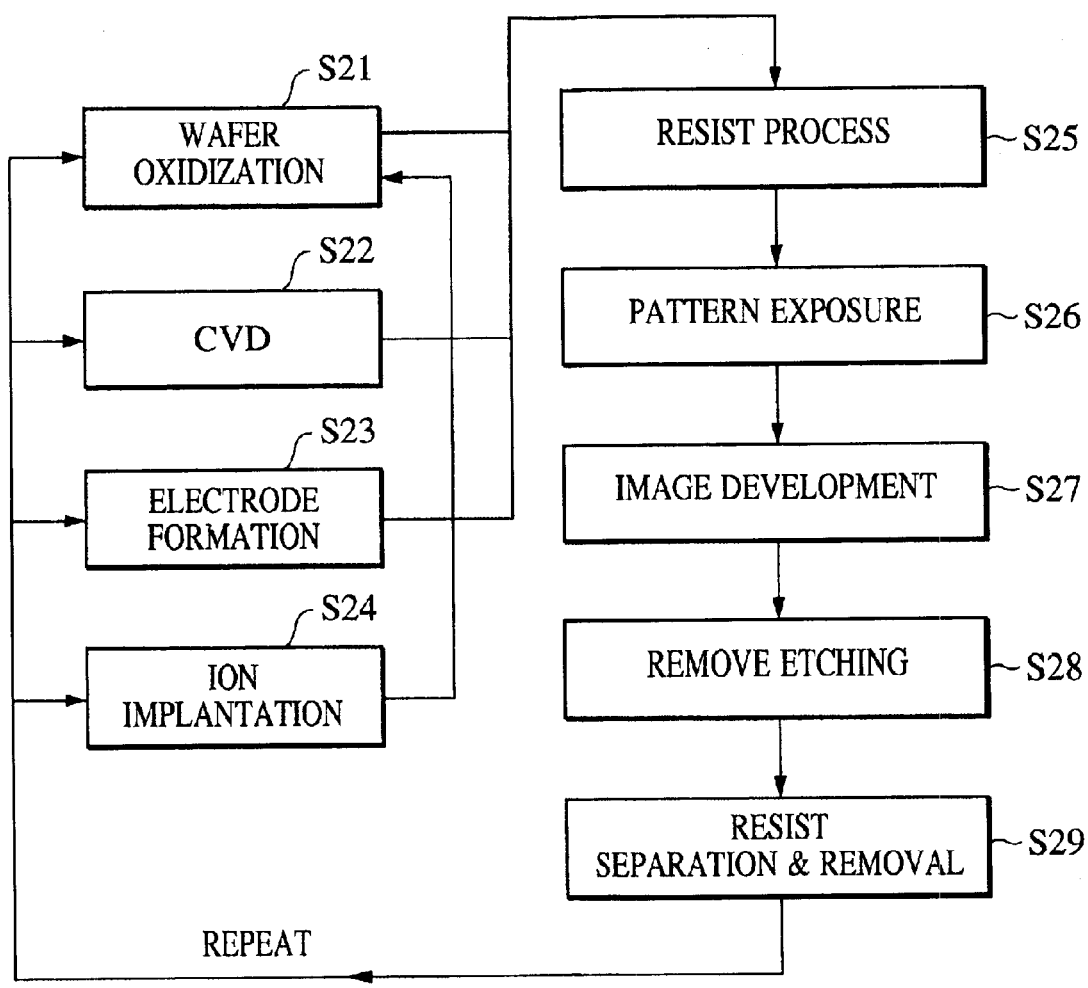
FIG. 13 is a detailed flowchart illustrating a wafer process step.
Figure 4A:
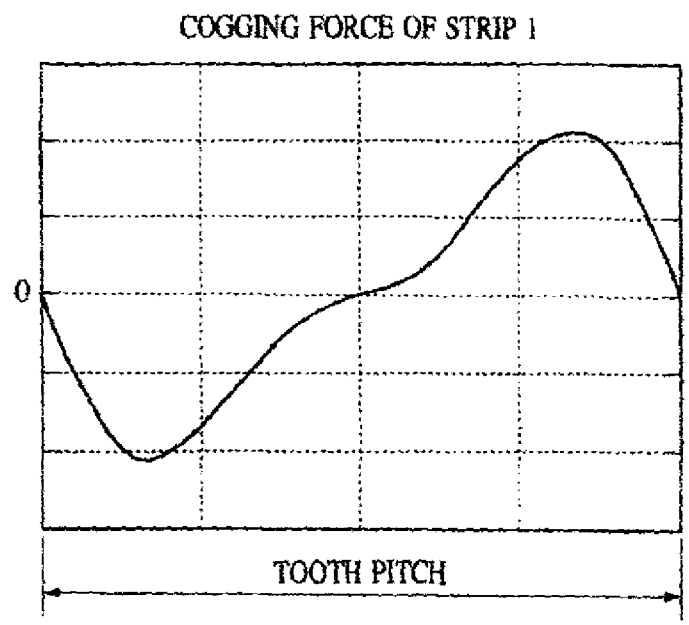
Figure 4B:
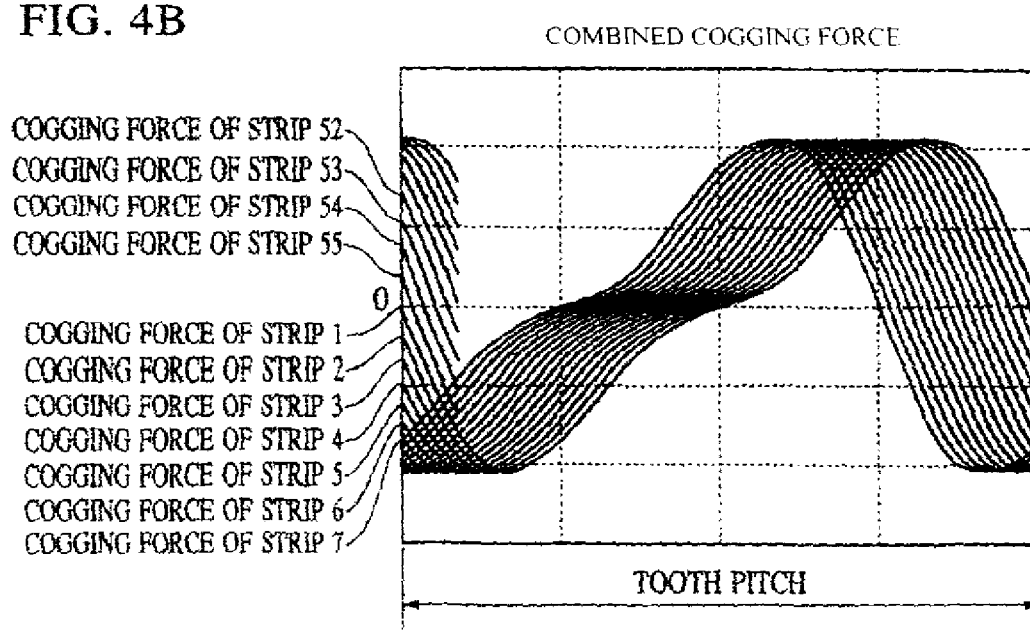

FIG. 13 illustrates a detailed flowchart of Step S14 for wafer processing. In Step S21, the surface of the wafer is oxidized. In Step S22, an insulating film is formed on the surface of the wafer by chemical-vapor deposition, i.e., CVD, for example. In Step S23, electrodes are formed on the wafer by CVD. In Step S24, ions are implanted in the wafer. In Step S25, a photosensitive agent is applied on the wafer for resist processing. In Step S26, the above-described aligner exposes the circuit pattern of the mask onto the wafer. In step S27, the exposed wafer is developed. In Step S28, a part of the surface of the wafer, which has no resist image developed thereon, is removed by etching. In Step S28, the remaining resist on the wafer, which becomes unnecessary after etching, is separated and removed. By repeating these Steps, multilayered circuit patterns are formed on the wafer. With the method for manufacturing semiconductor devices according to the fourth embodiment, highly integrated semiconductor devices can be manufactured.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A moving-magnet, linear motor, comprising:
   a mover including a plurality of permanent magnets disposed in a traveling direction of said mover; and
   at least one stator, said at least one stator including:
      a toothed iron-core having a plurality of teeth disposed so as to be positioned with a tooth pitch between each tooth of said plurality of teeth; and
      a plurality of coils, wherein each coil of said plurality of coils is wound around a respective tooth of said plurality of teeth,
   wherein at least one permanent magnet of said plurality of permanent magnets is skewed so that two longitudinal ends of said at least one permanent magnet are displaced, with respect to each other in the traveling direction, by an amount substantially equal to a positive, integral multiple of the tooth pitch.

2. The moving-magnet, linear motor according to claim 1, wherein said at least one permanent magnet has a shape, which is approximately a parallelogram.

3. The moving-magnet, linear motor according to claim 1, wherein said at least one permanent magnet has a shape, which is approximately a polygon.

4. The moving-magnet, linear motor according to claim 1,
   wherein a length of said at least one permanent magnet and a width of said toothed iron-core extend in a direction, which is orthogonal to the traveling direction of said moving mover, and
   wherein the length of said at least one permanent magnet is equal to or smaller than the width of said toothed iron-core.

5. The moving-magnet, linear motor according to claim 1, wherein the tooth pitch is equal to or smaller than a magnet cycle of said plurality of permanent magnets.

6. The moving-magnet, linear motor according to claim 1, wherein said at least one stator includes two stators, which are disposed so as to sandwich said mover therebetween.

7. An aligner for use in a semiconductor manufacturing apparatus for exposing a pattern formed on an original plate onto a substrate, said aligner comprising:
   at least one driver for driving at least one of the original plate and the substrate, said at least one driver including:
      a mover including a plurality of permanent magnets disposed in a traveling direction of said mover; and
      at least one stator, said at least one stator including:
         a toothed iron-core having a plurality of teeth disposed so as to be positioned with a tooth pitch between each tooth of said plurality of teeth; and
         a plurality of coils, wherein each coil of said plurality of coils is would around a respective tooth of said plurality of teeth, wherein at least one permanent magnet of said plurality of permanent magnets is skewed so that two longitudinal ends of said at least one permanent magnet are displaced, with respect to each other in the traveling direction, by an amount substantially equal to a positive, integral multiple of the tooth pitch.

8. A semiconductor manufacturing apparatus for exposing a pattern formed on an original plate onto a substrate, said apparatus comprising:

at least one driver for driving at least one of the original plate and the substrate, said at least one driver including:

a mover including a plurality of permanent magnets disposed in a traveling direction of said mover; and at least one stator, said at least one stator including:

a toothed iron-core having a plurality of teeth disposed so as to be positioned with a tooth pitch between each tooth of said plurality of teeth; and a plurality of coils, wherein each coil of said plurality of coils is would around a respective tooth of said plurality of teeth, wherein at least one permanent magnet of said plurality of permanent magnets is skewed so that two longitudinal ends of said at least one permanent magnet are displaced, with respect to each other in the traveling direction, by an amount substantially equal to a positive, integral multiple of the tooth pitch; and an exposing device for exposing the pattern.

9. A method for manufacturing semiconductor devices, said method comprising the steps of:

applying a photosensitive agent on a substrate;

exposing a pattern formed on an original plate onto the substrate having the photosensitive agent applied thereon, wherein said exposing step is performed using an aligner for use in a semiconductor manufacturing apparatus for exposing a pattern formed on the original plate onto the substrate, the aligner including:

a mover including a plurality of permanent magnets disposed in a traveling direction of the mover; and at least one stator, said at least one stator including:

a toothed iron-core having a plurality of teeth disposed so as to be positioned with a tooth pitch between each tooth of said plurality of teeth; and a plurality of coils, wherein each coil of said plurality of coils is would around a respective tooth of said plurality of teeth, wherein at least one permanent magnet of said plurality of permanent magnets is skewed so that two longitudinal ends of said at least one permanent magnet are displaced, with respect to each other in the traveling direction, by an amount substantially equal to a positive, integral multiple of the tooth pitch; and developing the substrate having the pattern exposed thereon.

10. A moving-magnet, linear motor, comprising:

a mover including a plurality of permanent magnets disposed in a traveling direction of said mover; and at least one stator, said at least one stator including:

a toothed iron-core having a plurality of teeth disposed so as to be positioned with a tooth pitch between each tooth of said plurality of teeth; and a plurality of coils, wherein each coil of said plurality of coils is wound around a respective tooth of said plurality of teeth, wherein a cogging force produced by at least one permanent magnet of said plurality of permanent magnets has a phase, which changes from 0° to 360° in a substantially continuous manner in a direction along a length of said at least one permanent magnet.

11. The moving-magnet, linear motor according to claim 10, wherein said at least one permanent magnet has a shape, which is approximately a parallelogram.

12. The moving-magnet, linear motor according to claim 10, wherein said at least one permanent magnet has a shape, which is approximately a polygon.

13. The moving-magnet, linear motor according to claim 10, wherein the length of said at least one permanent magnet and a width of said toothed iron-core extend in a direction, which is orthogonal to a traveling direction of said mover, and wherein the length of said at least one permanent magnet is equal to or smaller than the width of said toothed iron-core.

14. The moving-magnet, linear motor according to claim 10, wherein the tooth pitch is equal to or smaller than a magnet cycle of said plurality of permanent magnets.

15. The moving-magnet, linear motor according to claim 10, wherein said at least one stator includes two stators disposed so as to sandwich said mover therebetween.

16. An aligner for use in a semiconductor manufacturing apparatus for exposing a pattern formed on an original plate onto a substrate, said aligner comprising:

at least one driver for driving at least one of the original plate and the substrate, said at least one driver including:

a mover including a plurality of permanent magnets disposed in a traveling direction of said mover; and at least one stator, said at least one stator including:

a toothed iron-core having a plurality of teeth disposed so as to be positioned with a tooth pitch between each tooth of said plurality of teeth; and a plurality of coils, wherein each coil of said plurality of coils is would around a respective tooth of said plurality of teeth, wherein a cogging force produced by at least one permanent magnet of said plurality of permanent magnets has a phase, which changes from 0° to 360° in a substantially continuous manner in a direction along a length of said at least one permanent magnet.

17. A semiconductor manufacturing apparatus for exposing a pattern formed on an original plate onto a substrate, said apparatus comprising:

at least one driver for driving at least one of the original plate and the substrate, said at least one driver including:

a mover including a plurality of permanent magnets disposed in a traveling direction of said mover; and at least one stator, said at least one stator including:

a toothed iron-core having a plurality of teeth disposed so as to be positioned with a tooth pitch between each tooth of said plurality of teeth; and a plurality of coils, wherein each coil of said plurality of coils is would around a respective tooth of said plurality of teeth, wherein a cogging force produced by at least one permanent magnet of said plurality of permanent magnets has a phase, which changes from 0° to 360° in a substantially continuous manner in a direction along a length of said at least one permanent magnet; and an exposing device for exposing the pattern.

18. A method for manufacturing semiconductor devices, comprising the steps of:

applying a photosensitive agent on a substrate;

exposing a pattern formed on an original plate onto the substrate having the photosensitive agent applied thereon, wherein said exposing step is performed using an aligner for use in a semiconductor manufacturing apparatus for exposing a pattern formed on the original plate onto the substrate, said aligner including:

at least one driver for driving at least one of the original plate and the substrate, said at least one driver including:

a mover including a plurality of permanent magnets disposed in a traveling direction of the mover; and at least one stator, said at least one stator including:

a toothed iron-core having a plurality of teeth disposed so as to be positioned with a tooth pitch between each tooth of said plurality of teeth; and a plurality of coils, wherein each coil of said plurality of coils is would around a respective tooth of said plurality of teeth, wherein at least one permanent magnet of said plurality of permanent magnets is skewed so that two longitudinal ends of said at least one permanent magnet are displaced, with respect to each other in the traveling direction, by an amount substantially equal to a positive, integral multiple of the tooth pitch; and developing the substrate having the pattern exposed thereon.

* * * * *

UNITED STATES PATENT AND TRADEMARK OFFICE
CERTIFICATE OF CORRECTION

PATENT NO.   : 6,791,214 B2
DATED        : September 14, 2004
INVENTOR(S)  : Nobushige Korenaga It is certified that error appears in the above-identified patent and that said Letters Patent is hereby corrected as shown below:

Drawings,
Sheet 4, Figure 4B, "COGING" should read -- COGGING --. (as shown on the attached)

Column 10,
Line 66, "would" should read -- wound --.

Column 11,
Lines 19 and 45, "would" should read -- wound --.

Column 12,
Lines 38 and 59, "would" should read -- wound --.

Column 14,
Line 7, "would" should read -- wound --.

Signed and Sealed this

Seventh Day of June, 2005

JON W. DUDAS
*Director of the United States Patent and Trademark Office*